US012615968B2

(12) United States Patent     (10) Patent No.:   US 12,615,968 B2

Good et al.     (45) Date of Patent:    Apr. 28, 2026

(54) PROTECTIVE SEALANT FOR CHALCOGENIDE MATERIAL AND METHODS FOR FORMING THE SAME

(71) Applicant: Micron Technology, Inc., Boise, ID (US)

(72) Inventors: Farrell M. Good, Meridian, ID (US); Robert K. Grubbs, Boise, ID (US); Gurpreet S. Lugani, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/634,079

(22) Filed: Apr. 12, 2024

(65) Prior Publication Data

US 2024/0268240 A1    Aug. 8, 2024

Related U.S. Application Data

(62) Division of application No. 17/881,285, filed on Aug. 4, 2022, now Pat. No. 11,980,108, which is a division of application No. 16/731,963, filed on Dec. 31, 2019, now Pat. No. 11,417,840.

(51) Int. Cl.
*H10N 70/00*     (2023.01)

(52) U.S. Cl.
CPC ......... *H10N 70/063* (2023.02); *H10N 70/826* (2023.02); *H10N 70/882* (2023.02)

(58) Field of Classification Search
CPC ... H10N 70/063; H10N 70/826; H10N 70/882
See application file for complete search history.

(56) References Cited

U.S. PATENT DOCUMENTS

| | | | |
|---|---|---|---|
| 6,753,247 B1 | 6/2004 | Okoroanyanwu et al. | |
| 9,385,318 B1 | 7/2016 | Henri | |
| 9,419,212 B2 * | 8/2016 | Petz ..................... | H10N 70/882 |
| 9,484,196 B2 | 11/2016 | Song et al. | |
| 9,607,691 B1 | 3/2017 | Allegra et al. | |
| 9,768,378 B2 | 9/2017 | Pellizzer et al. | |

(Continued)

FOREIGN PATENT DOCUMENTS

| | | |
|---|---|---|
| CN | 106030842 A | 10/2016 |
| CN | 108630761 A | 10/2018 |

(Continued)

OTHER PUBLICATIONS

Korean patent office, "KR Office Action," issued in connection with Korean Patent Application No. 10-2022-7025975 dated Aug. 30, 2024 (26 pages) (13 pages of English Translation and 13 pages of Original Document).

(Continued)

*Primary Examiner* — Mounir S Amer

(74) *Attorney, Agent, or Firm* — Holland & Hart LLP

(57) ABSTRACT

Techniques are described to form a liner to protect a material, such as a storage element material, from damage during subsequent operations or phases of a manufacturing process. The liner may be bonded to the material (e.g., a chalcogenide material) using a strong bond or a weak bond. In some cases, a sealant material may be deposited during an etching phase of the manufacturing process to prevent subsequent etching operations from damaging a material that has just been etched.

14 Claims, 12 Drawing Sheets

(56) References Cited

U.S. PATENT DOCUMENTS

| | | | |
|---|---|---|---|
| 10,249,819 B2 | 4/2019 | Campbell et al. | |
| 10,381,072 B2 | 8/2019 | Hu et al. | |
| 11,437,571 B2 * | 9/2022 | Kim ...................... H10B 63/84 |
| 2015/0243708 A1 | 8/2015 | Ravasio et al. | |
| 2015/0287916 A1 | 10/2015 | Campbell et al. | |
| 2016/0093484 A1 | 3/2016 | Marsh | |
| 2017/0092857 A1 | 3/2017 | Hausmann | |
| 2017/0243919 A1 | 8/2017 | Seong et al. | |
| 2017/0331036 A1 | 11/2017 | Collins et al. | |
| 2018/0114903 A1 | 4/2018 | Hausmann | |
| 2018/0269059 A1 | 9/2018 | Lin et al. | |
| 2019/0088873 A1 | 3/2019 | Fantini et al. | |
| 2021/0091140 A1 | 3/2021 | Ravasio et al. | |

FOREIGN PATENT DOCUMENTS

| | | | |
|---|---|---|---|
| JP | 2008-288292 A | 11/2008 | |
| JP | 2017-034245 A | 2/2017 | |
| JP | 2017-092455 A | 5/2017 | |
| KR | 10-2017-0013832 A | 2/2017 | |
| KR | 10-2019-0070365 A | 6/2019 | |
| WO | 2019/009876 A1 | 1/2019 | |

OTHER PUBLICATIONS

European Patent Office, "Supplementary European search report," issued in connection with European Patent Application No. 20908539.8 dated Jul. 21, 2023 (9 pages).

International Search Report and Written Opinion received for PCT Patent Application No. PCT/US20/066471, mailed on Apr. 15, 2021, 12 pages.

Chinese patent office, "China Office Action," issued in connection with China Patent Application No. 202080093601.5 dated Jun. 10, 2025 (23 pages) (11 pages of English Translation and 12 pages of Original Document).

* cited by examiner

205

245

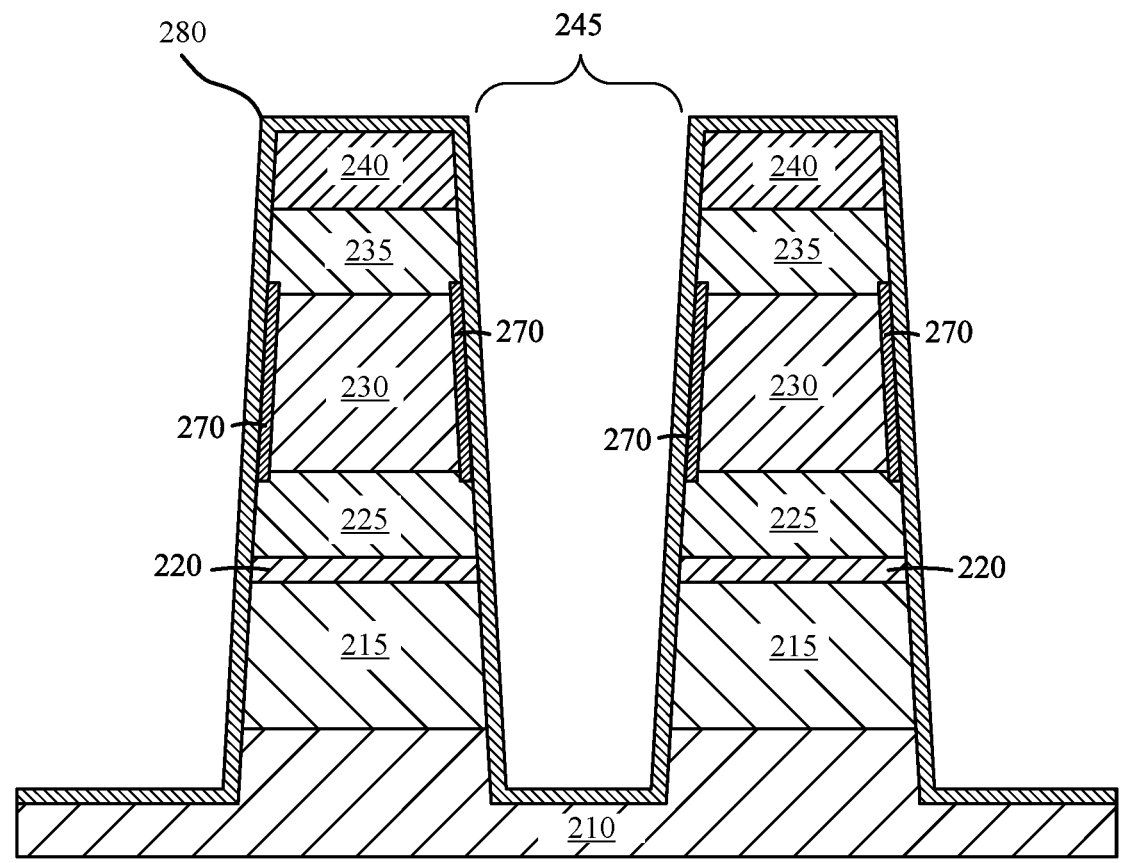
FIG. 2E

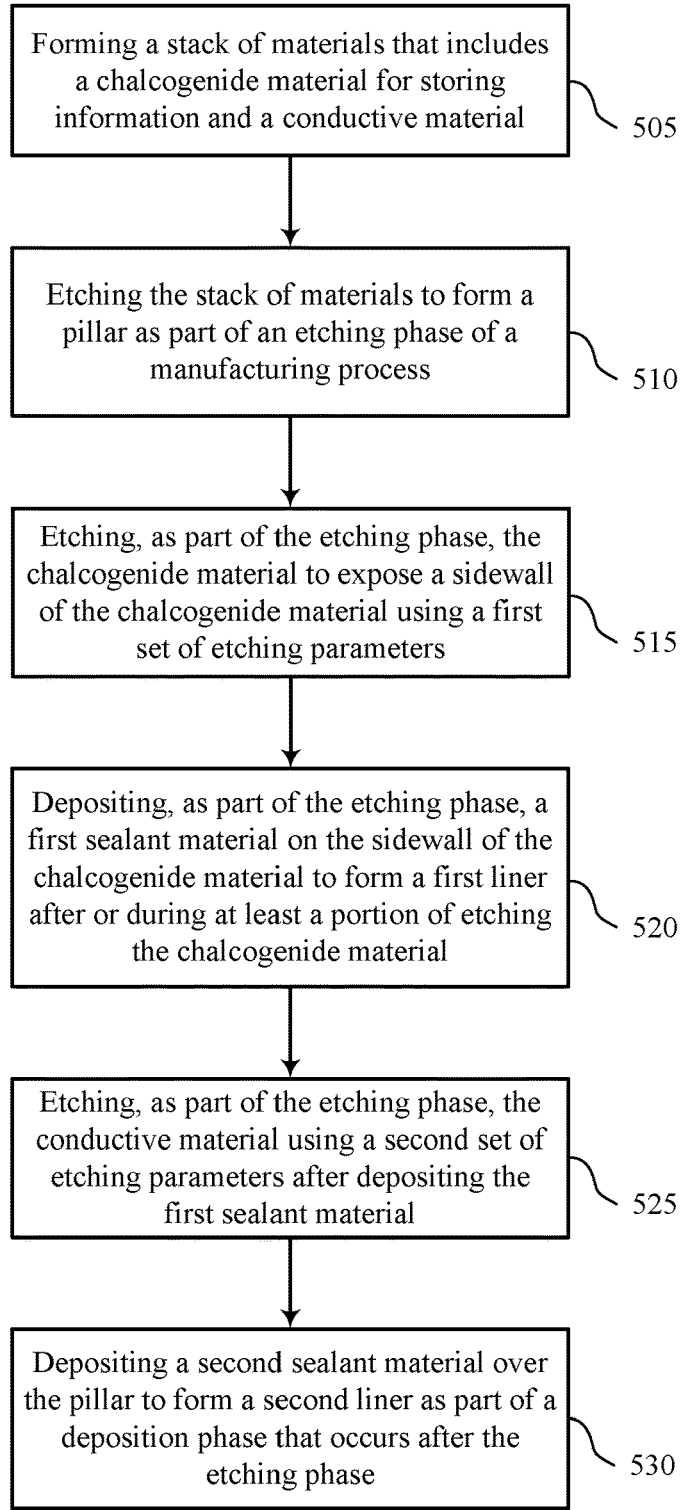

Forming a stack of materials that includes a chalcogenide material for storing information and a conductive material ⟍ 505

Etching the stack of materials to form a pillar as part of an etching phase of a manufacturing process ⟍ 510

Etching, as part of the etching phase, the chalcogenide material to expose a sidewall of the chalcogenide material using a first set of etching parameters ⟍ 515

Depositing, as part of the etching phase, a first sealant material on the sidewall of the chalcogenide material to form a first liner after or during at least a portion of etching the chalcogenide material ⟍ 520

Etching, as part of the etching phase, the conductive material using a second set of etching parameters after depositing the first sealant material ⟍ 525

Depositing a second sealant material over the pillar to form a second liner as part of a deposition phase that occurs after the etching phase ⟍ 530

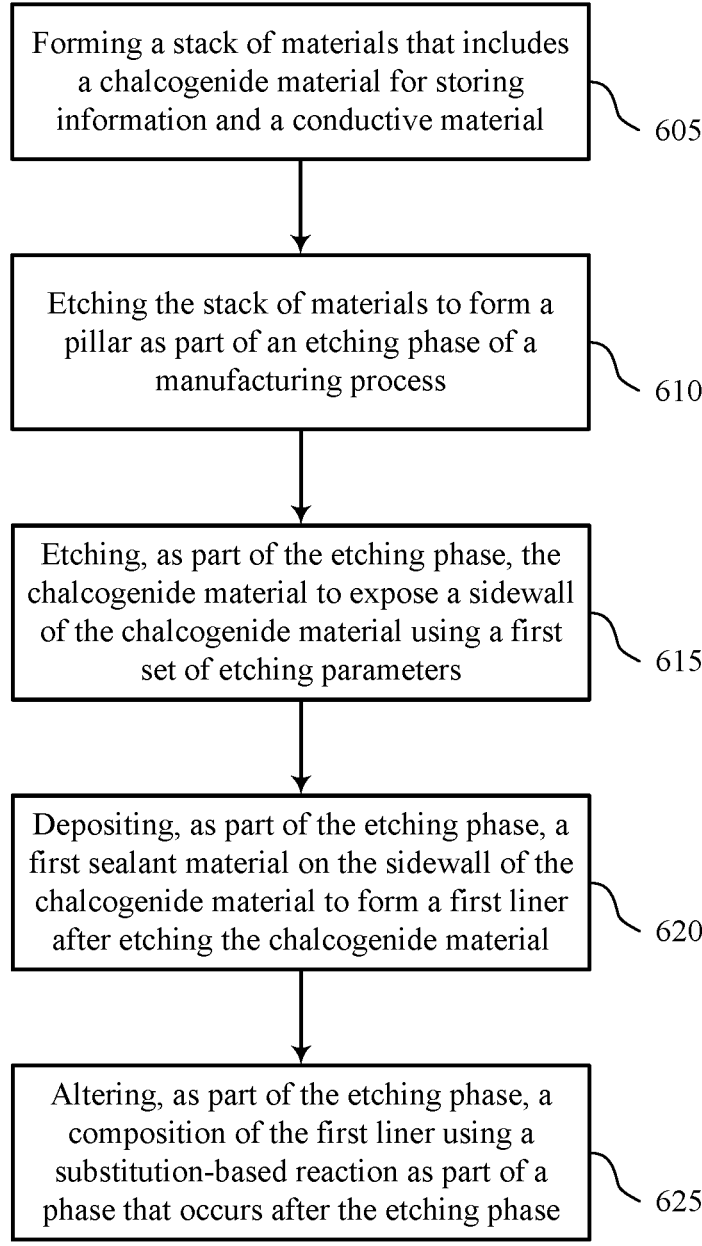

Forming a stack of materials that includes a chalcogenide material for storing information and a conductive material ⟍ 605

Etching the stack of materials to form a pillar as part of an etching phase of a manufacturing process ⟍ 610

Etching, as part of the etching phase, the chalcogenide material to expose a sidewall of the chalcogenide material using a first set of etching parameters ⟍ 615

Depositing, as part of the etching phase, a first sealant material on the sidewall of the chalcogenide material to form a first liner after etching the chalcogenide material ⟍ 620

Altering, as part of the etching phase, a composition of the first liner using a substitution-based reaction as part of a phase that occurs after the etching phase ⟍ 625

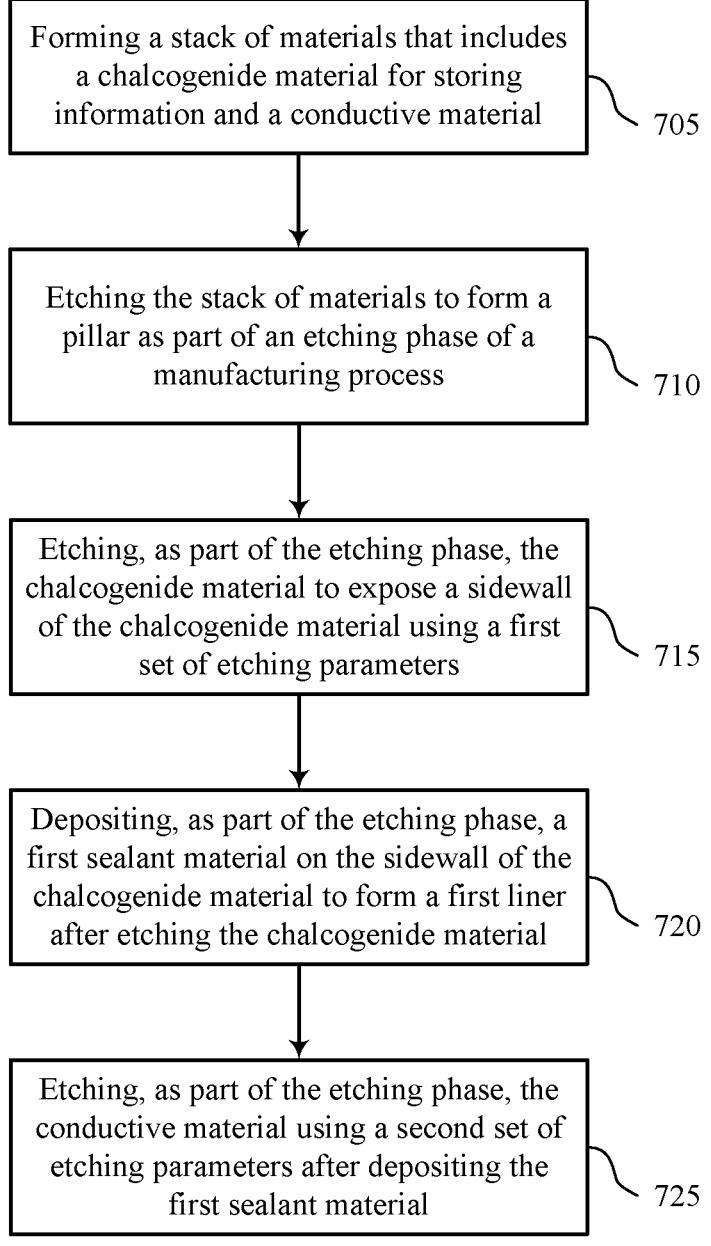

Forming a stack of materials that includes a chalcogenide material for storing information and a conductive material ⟍ 705

Etching the stack of materials to form a pillar as part of an etching phase of a manufacturing process ⟍ 710

Etching, as part of the etching phase, the chalcogenide material to expose a sidewall of the chalcogenide material using a first set of etching parameters ⟍ 715

Depositing, as part of the etching phase, a first sealant material on the sidewall of the chalcogenide material to form a first liner after etching the chalcogenide material ⟍ 720

Etching, as part of the etching phase, the conductive material using a second set of etching parameters after depositing the first sealant material ⟍ 725

PROTECTIVE SEALANT FOR CHALCOGENIDE MATERIAL AND METHODS FOR FORMING THE SAME

CROSS REFERENCE

The present Application for Patent is a divisional of U.S. patent application Ser. No. 17/881,285 by Good, et al., entitled "PROTECTIVE SEALANT FOR CHALCO-GENIDE MATERIAL AND METHODS FOR FORMING THE SAME", filed Aug. 4, 2022, which is a divisional of U.S. patent application Ser. No. 16/731,963 by Good et al., entitled "PROTECTIVE SEALANT FOR CHALCO-GENIDE MATERIAL AND METHODS FOR FORMING THE SAME," filed Dec. 31, 2019, each of which is assigned to the assignee hereof, and each of which is expressly incorporated by reference in its entirety herein.

BACKGROUND

The following relates generally to one or more systems that includes at least one memory device and more specifically to a protective sealant for chalcogenide material and methods for forming the same.

Memory devices are widely used to store information in various electronic devices such as computers, wireless communication devices, cameras, digital displays, and the like. Information is stored by programing different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), other chalcogenide-based memories, and others. Memory devices may be volatile or non-volatile.

Improving memory devices, generally, may include increasing memory cell density, increasing read/write speeds, increasing reliability, increasing data retention, reducing power consumption, or reducing manufacturing costs, among other metrics. Solutions for saving space in the memory array, increasing the memory cell density, or decreasing overall power usage of the memory array may be desired.

BRIEF DESCRIPTION OF THE DRAWINGS

FIGS. 2A through 2E illustrate various views of example memory arrays that supports protective sealant for chalcogenide material and methods for forming the same in accordance with examples as disclosed herein.

FIGS. 5 through 8 show flowcharts illustrating a method or methods that support protective sealant for chalcogenide material and methods for forming the same in accordance with examples as disclosed herein.

DETAILED DESCRIPTION

Some memory devices may include chalcogenide materials to function as a storage component of a memory cell to store data. As the size of the components of the memory device get smaller, the damage caused by etching to some materials may begin to affect performance of those materials. For example, the effectiveness of a memory cell at storing data may be related to an amount of chalcogenide material in the memory cell that is undamaged or active. After a sidewall of the chalcogenide material is exposed using an etching operation, subsequent steps (such as etching an electrode material, cleaning phases, deposition phases, or exposure to air) may damage the chalcogenide material and/or cause unwanted chemical constituent mixing in chalcogenide material, thereby reducing the volume of bulk, or active material, of the chalcogenide material that is useful for storing information. In a more specific example, if a process damages one micrometer of a material, the percentage of the bulk, or active material, that is damaged will be based on the total size of the material. As the size of the material gets smaller, the percentage of the bulk material damaged by a given process may increase.

Techniques are described to form a liner to protect a material, such as a storage element material, from damage during subsequent operations or phases of a manufacturing process. The liner may be bonded to the material (e.g., a chalcogenide material) using a strong bond or a weak bond. In some cases, a sealant material may be deposited during an etching phase of the manufacturing process to prevent subsequent etching operations from damaging a material that has just been etched.

Features of the disclosure are initially described in the context of a memory array as described with reference to FIG. 1. Features of the disclosure are described in the context memory arrays and bonding cases as described with reference to FIGS. 2A-4. These and other features of the disclosure are further illustrated by and described with reference to flowcharts that relate to protective sealant for chalcogenide material and methods for forming the same as described with references to FIGS. 5-8.

Figure 1:
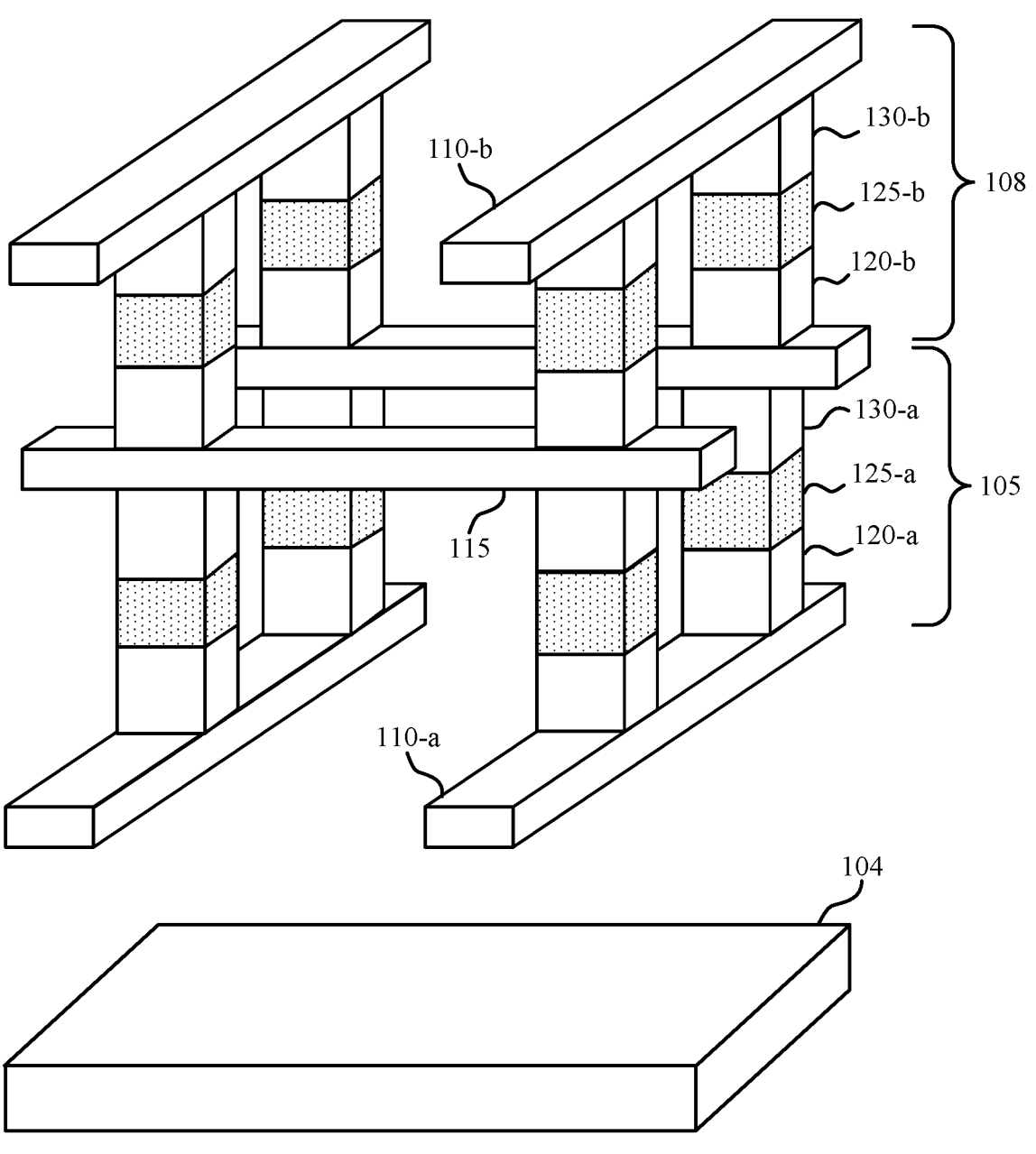
FIG. 1 illustrates an example of a memory array that supports protective sealant for chalcogenide material and methods for forming the same in accordance with examples as disclosed herein.

FIG. 1 illustrates an example of a memory array 100 (e.g., a three-dimensional (3D) memory array) that supports a protective sealant for chalcogenide material and methods for forming the same in accordance with examples as disclosed herein. Memory array 100 may include a first array or deck 105 of memory cells that is positioned above a substrate 104 and a second array or deck 108 of memory cells on top of the first array or deck 105 and/or more decks repeated on top of deck 108.

Memory array 100 may include word lines 110 (e.g., word lines 110-a and 110-b) and digit lines 115. Memory cells of the first deck 105 and the second deck 108 each may have one or more self-selecting memory cells. Memory cells of the first deck 105 and the second deck 108 each may have zero, one or more memory cells (e.g., memory cell 125-a and memory cell 125-b, respectively). Although some elements included in FIG. 2 are labeled with a numeric indicator, other corresponding elements are not labeled, though they are the same or would be understood to be similar, in an effort to increase visibility and clarity of the depicted features.

Memory cells of the first deck 105 may include first electrode 120-*a*, memory cell 125-*a* (e.g., including chalcogenide material), and second electrode 130-*a*. In addition, memory cells of the second deck 108 may include a first electrode 120-*b*, memory cell 125-*b* (e.g., including chalcogenide material), and second electrode 130-*b*. The memory cells of the first deck 105 and second deck 108 may in some examples, have common conductive lines such that corresponding memory cells of each deck 105 and 108 may share bit lines 115 or word lines 110. For example, first electrode 120-*b* of the second deck 108 and the second electrode 130-*a* of the first deck 105 may be coupled to the bit line 115 such that bit line 115 is shared by vertically adjacent memory cells. A decoder may be positioned above or below each deck if the memory array 100 includes more than one deck. For example, a decoder may be positioned above first deck 105 and above second deck 108. In some cases, the memory cells 125 may be examples of phase-change memory cells or self-selecting memory cells.

In some examples, a memory cell may be programmed by providing an electric pulse to the cell, which may include a memory storage element. The pulse may be provided via a first access line (e.g., word line 110) or a second access line (e.g., digit line 115), or a combination thereof. In some cases, upon providing the pulse, ions may migrate within the memory storage element, depending on the polarity of the memory cell. Thus, a concentration of ions or atoms relative to the first side or the second side of the memory storage element may be based at least in part on a polarity of a voltage between the first access line and the second access line. In some cases, asymmetrically shaped memory storage elements may cause ions to be more crowded at portions of an element having more area. Certain portions of the memory storage element may have a higher resistivity and thus may give rise to a higher threshold voltage than other portions of the memory storage element. This description of ion migration represents an example of a mechanism of the self-selecting memory cell for achieving the results described herein. This example of a mechanism should not be considered limiting. This disclosure also includes other examples of mechanisms of the self-selecting memory cell for achieving the results described herein.

The architecture of memory array 100 may be referred to as a cross-point architecture, in some cases, in which a memory cell is formed at a topological cross-point between a word line and a bit line as illustrated in FIG. 1. Such a cross-point architecture may offer relatively high-density data storage with lower production costs compared to other memory architectures. For example, the cross-point architecture may have memory cells with a reduced area and, resultantly, an increased memory cell density compared to other architectures. For example, the architecture may have a 4F2 memory cell area, where F is the smallest feature size, compared to other architectures with a 6F2 memory cell area, such as those with a three-terminal selection component. For example, DRAM may use a transistor, which is a three-terminal device, as the selection component for each memory cell and may have a larger memory cell area compared to the cross-point architecture.

While the example of FIG. 1 shows two memory decks, other configurations are possible. In some examples, a single memory deck of memory cells may be constructed above a substrate 104, which may be referred to as a two-dimensional memory. In some examples, a three or four memory decks of memory cells may be configured in a similar manner in a three-dimensional cross point architecture.

In some examples, one or more of the memory decks may include a memory cell 125 that includes chalcogenide material. The memory cell 125 may for example, include a chalcogenide glass such as, for example, an alloy of selenium (Se), tellurium (Te), arsenic (As), antimony (Sb), carbon (C), germanium (Ge), and silicon (Si). In some example, a chalcogenide material having primarily selenium (Se), arsenic (As), and germanium (Ge) may be referred to as SAG-alloy. In some examples, SAG-alloy may include silicon (Si) or indium (In) or a combination thereof and such chalcogenide materials may be referred to as SiSAG-alloy or InSAG-alloy, respectively, or a combination thereof. In some examples, the chalcogenide glass may include additional elements such as hydrogen (H), oxygen (O), nitrogen (N), chlorine (Cl), or fluorine (F), each in atomic or molecular forms.

In some examples, a memory cell 125 including chalcogenide material may be programmed to a logic state by applying a first voltage. By way of example, when a particular memory cell 125 is programed, elements within the cell separate, causing ion migration. Ions may migrate towards a particular electrode, depending on the polarity of the voltage applied to the memory cell. For example, in a memory cell 125, ions may migrate towards the negative electrode. The memory cell may then be read by applying a voltage across the cell to sense. The threshold voltage seen during a read operation may be based on the distribution of ions in the memory cell and the polarity of the read pulse. In other examples, when a particular memory cell 125 is programmed using a voltage, a structural phase change may be induced in the cell material making it either crystalline or amorphous. The memory cell 125 may be read by applying a voltage across the cell to sense either the high resistance state of an amorphous memory cell or a low resistance state of a crystalline memory cell.

In some cases, a first voltage may be applied to a first conductive line of a decoder as part of an access operation of the memory cell 125. Upon applying the first voltage, the first conductive line may be coupled with the access line (e.g., word line 110-*a*, word line 110-*b*, or bit line 115) associated with the memory cell 125. For example, the first conductive line may be coupled with the access line based on a doped material of the decoder which extends between the first conductive line and the access line in a first direction.

In some examples, the first voltage may be applied to the memory cell 125 based on coupling the first conductive line of the decoder with the access line. The decoder may include one or more doped materials that extend between the first conductive line and the access line of the memory array 100 of memory cells in a first direction away from a surface of the substrate 104. In some cases, the decoder may be coupled with the substrate 104.

A liner may be formed in the memory array 100 to protect a material, such as a the memory cell 125, from damage during subsequent operations or phases of a manufacturing process. The liner may be bonded to the material (e.g., a chalcogenide material) using a strong bond or a weak bond. In some cases, a sealant material may be deposited during an etching phase of the manufacturing process to prevent subsequent etching operations from damaging a material that has just been etched.

FIGS. 2A-2E illustrate various views of example memory arrays 200-*a*, 200-*b*, 200-*c*, 200-*d*, and 200-*e* during a series of steps or processes that may be performed to form a stacked memory device, in accordance with examples as disclosed herein. Specifically, in FIGS. 2A-2E, a method of forming protective bond substitutions for chalcogenide cell material in the memory array structures is shown.

Various techniques may be used to form materials or components of memory array 200. These may include, for example, chemical vapor deposition (CVD), metal-organic chemical vapor deposition (MOCVD), physical vapor deposition (PVD), sputter deposition, atomic layer deposition (ALD), or molecular beam epitaxy (MBE), among other thin film growth techniques. Material may be removed using a number of techniques, which may include, for example, chemical etching (also referred to as "wet etching"), plasma etching (also referred to as "dry etching"), or chemical-mechanical planarization.

While not shown for clarity and ease of illustration, it will be understood that the illustrated array structures are formed over a substrate, which can include, among other things, various peripheral and supporting circuitry, for instance complementary metal-oxide-semiconductor (CMOS) transistors that form a part of column and row driver circuitry and sense amplifier circuitry, as well as sockets and wiring that connect such circuitry to the memory array through the columns and rows described above. In addition, the substrate may include one or more memory arrays, or "decks" of arrays. As used herein, the term substrate includes a bulk semiconductor substrate as well as integrated structures formed thereover.

Figure 2A:
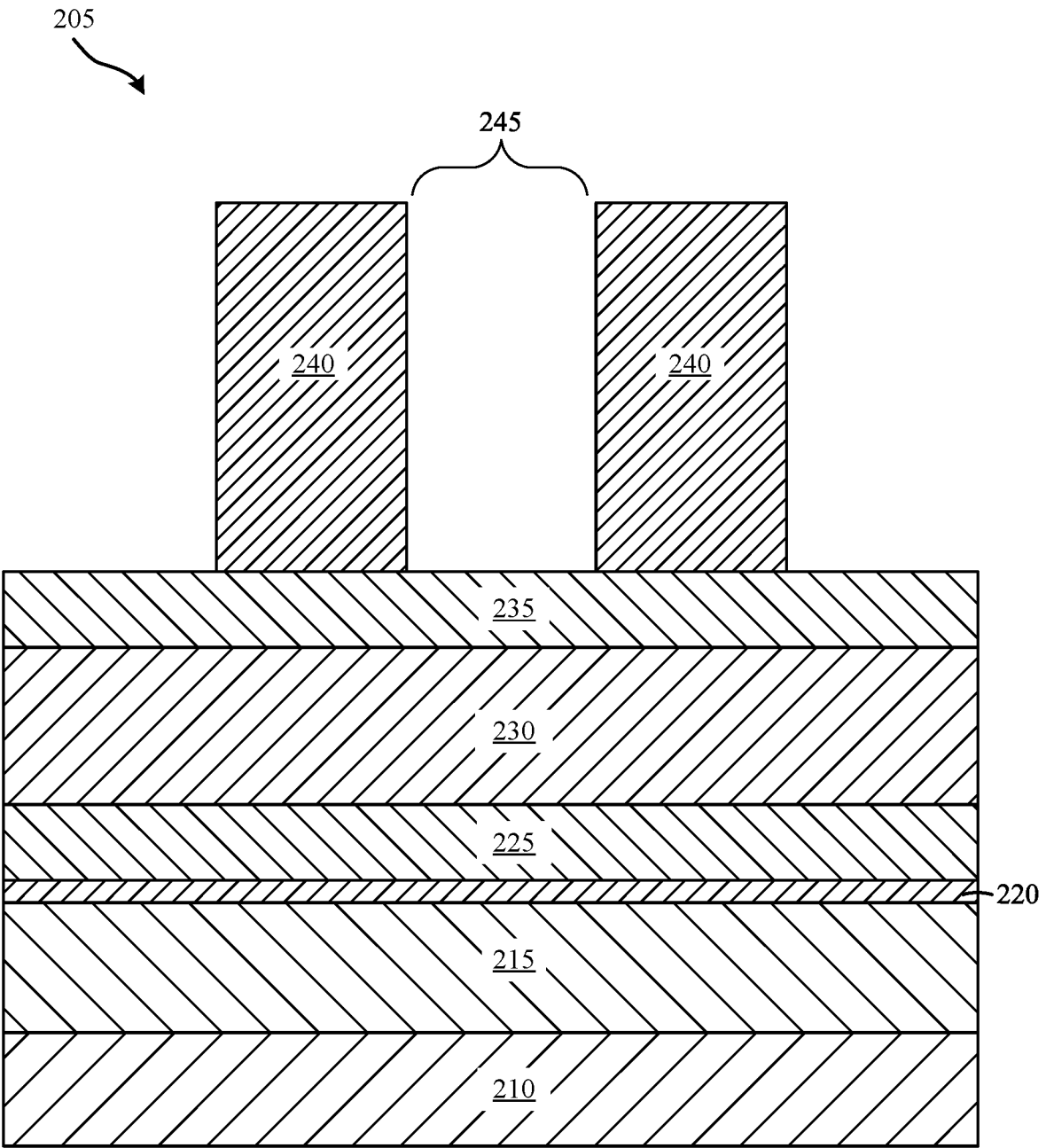

FIG. 2A illustrates a cross-sectional view of a memory array 200-*a* that supports a protective sealant for chalcogenide material and methods for forming the same in accordance with examples as disclosed herein. The memory array 200-*a* may include a stack 205 of materials formed in earlier processing steps. The stack 205 may be configured to eventually form a plurality of memory cells, as is described herein.

The stack 205 of materials may include a plurality of materials positioned on top of and adjacent to other materials in the stack 205. The stack 205 of materials may include an oxide material 210, a conductive material 215, a lamina material 220, a bottom electrode material 225, a chalcogenide material 230, a top electrode material 235, and one or more hard mask materials 240.

The oxide material 210 may be positioned at a bottom of the stack 205 of materials. In some examples, the oxide material 210 may be an example of a substrate associated with memory cells. The oxide material 210 may be an example of a dielectric material. In some examples, the oxide material 210 may be formed over a hard mask (not shown).

The conductive material 215 may be operable as an access line for one or more memory cells. In some examples, the conductive material 215 may be an example of a word line associated with a memory cell. The conductive material 215 may be coupled with the oxide material 210 or may be positioned above the oxide material 210, in some cases. The conductive material 215 may include tungsten or copper, or combinations thereof. In some examples, the conductive material 215 may be used to form a conductive line.

The lamina material 220 may be an example of a thin metal lamina. The lamina material 220 may be coupled or positioned above the conductive material 215.

The bottom electrode material 225 may be an example of an electrical conductor or electrical contact with the chalcogenide material 230. The bottom electrode material 225 may be positioned between the lamina material 220 and the chalcogenide material 230. In some examples, the bottom electrode material 225 may be coupled with the conductive material 215. In such examples, the lamina material 220 may not be present in the stack 205 of materials. In some examples, the bottom electrode material 225 may be formed of a carbon-based material or nitride material. In some cases, the bottom electrode material 225 may be referred to as a conductive material.

The chalcogenide material 230 may be operable to store data based on voltages being applied to the chalcogenide material 230. For example, the chalcogenide material 230 may be operable to store a first state based on a first voltage pulse being applied and a second state based on a second voltage pulse being applied. The chalcogenide material 230 may be used to form any type of chalcogenide-based memory cell including phase change memory cells, self-selecting memory cells, or another type of memory cell formed using chalcogenide. The chalcogenide material 230 may be coupled with the bottom electrode material 225, the top electrode material 235, or a combination thereof. The chalcogenide material 230 may be an example of a storage element material. In some cases, the chalcogenide material 230 may form a storage element. In some cases, the chalcogenide material 230 may form another type of element, such as a selector. In some cases, the features described with reference to the chalcogenide material 230 may be applied to other types of materials, including other types of storage element materials.

The top electrode material 235 may be an example of an electrical conductor or electrical contact with the chalcogenide material 230. The top electrode material 235 may be positioned above the chalcogenide material 230. In some examples, the top electrode material 235 may be formed of a carbon-based material or nitride material. In some cases, the top electrode material 235 may be referred to as a conductive material.

The hard mask material 240 may be positioned above and coupled with the top electrode material 235. The hard mask material 240 may be an example of an etch mask that protects portions of the underlying materials. In such examples, areas under the hard mask material 240 may be protected from etching during an etching phase of a manufacturing process. One or more trenches, such as trench 245 may be formed in or between hard mask materials 240. The trench 245 may be formed at least in part utilizing a photolithographic mask technique, for example. An etching operation may remove material using a variety of techniques, which may include, for example, chemical etching (also referred to as "wet etching"), plasma etching (also referred to as "dry etching"), or a combination thereof.

A manufacturing process for forming an array of memory cells may include forming the stack 205 of materials of the memory array 200-*a*. From the stack 205, memory cells may be formed by the manufacturing process. The manufacturing process may include one or more phases that each may define one or more parameters for advancing a step of the manufacturing process. Examples of phases may be one or more etching phases for etching at least a portion of material, one or more deposition phases for depositing material onto the stack 205, and one or more cleaning phases for removing contaminants from the stack 205 of material. Each phase may include one or more etching procedures, one or more deposition procedures, or one or more cleaning procedures, or a combination thereof. For example, an etching phase of the manufacturing process may include at least two different etching parameters. In such examples, a first set of etching parameters may be used to etch a first material (e.g., the chalcogenide material 230) and a second set of etching parameters, different than the first set, may be used to etch a second material (e.g., the bottom electrode material 225). Different sets of etching parameters may be used for different materials based on characteristics of the materials. For example, a first material may be softer than a second material and different parameters may reduce or mitigate unwanted damage to the materials being etched.

An etching phase may include etching multiple materials in stack 205. For example, a single etching phase may include etching the top electrode material 235, the chalcogenide material 230, and the bottom electrode material 225. Etching may occur from the top down and thus materials at the top of the stack 205 (e.g., the top electrode material 235) may be exposed to etch chemistries related to different sets of etching parameters. When a material higher in the stack 205 is softer or less resilient to certain etch chemistries (e.g., the chalcogenide material 230) than a material lower in the stack 205 (e.g., the bottom electrode material 225), the etch chemistries for etching the lower material (e.g., the bottom electrode material 225) may damage the higher material (e.g., the chalcogenide material 230).

Techniques are described herein for forming a liner on a surface of the chalcogenide material 230 to protect it from etch chemistries associated with other processes during the same etching phase or protect it from other chemistries or processes of other phases. During an etching phase, one or more surfaces of the chalcogenide material 230 may be exposed by an etching process. One or more materials may be deposited on one or more exposed surfaces of the chalcogenide material 230 during the etching phase to form a liner on the one or more exposed surfaces of the chalcogenide material 230. In some examples, the liner may create a strong bond with the chalcogenide material 230. In some examples, the liner may create a weak bond with the chalcogenide material 230. In such examples, the portions of the liner may be replaced during other processes or phases of the manufacturing process.

Figure 2B:
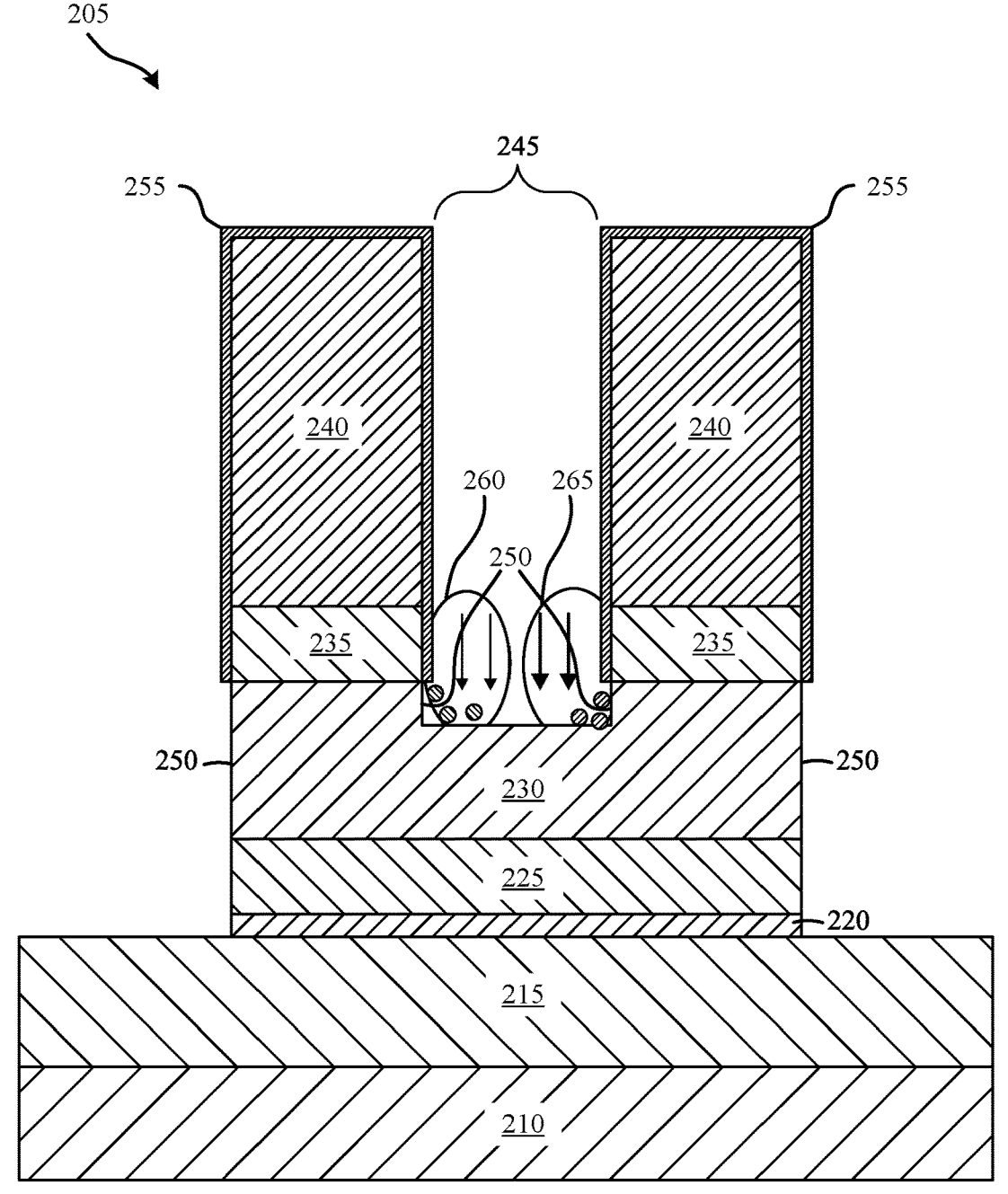

FIG. 2B illustrates a cross-sectional view of the memory array 200-*b* that supports a protective sealant for chalcogenide material and methods for forming the same in accordance with examples as disclosed herein. The memory array 200-*b* may be an example of the memory array 200-*a* described with reference to FIG. 2A during an etching phase for etching the stack 205 of materials. For example, the etching phase may be performed to form lines of chalcogenide material 230 from a continuous sheet of material. Creating such lines may bring the memory array 200-*b* closer to having individual memory cells formed of the chalcogenide material 230. The etching phase may extend the trench 245 deeper into the stack 205 material, especially in areas that are not protected by the hard mask materials 240.

The etching phase may expose sidewalls of one or more layers of the memory array 200-*b*. For example, the etching phase may expose one or more sidewalls of the top electrode material 235, the chalcogenide material 230, the bottom electrode material 225, the thin metal lamina 220 or a combination thereof may be exposed by the etching phase. For example, one or more sidewalls 250 of the chalcogenide material 230 may be exposed by the etching. In the example shown in FIG. 2B, a portion of some of the sidewalls 250 are exposed while other sidewalls 250 show a larger portion exposed. After the etching phase is complete, the sidewalls 250 may be fully exposed.

During the etching phase, different materials in the stack 205 may be etched and these different materials may use different etching parameters or wet or dry etch chemistries to remove the material. For example, the electrode materials 225 and 235 may be formed of a harder material than the chalcogenide material 230 and may use a stronger set of parameters or etch chemistries to make the etch. Because some materials may be etched after others, the etching of the subsequent materials may damage the materials that were etched previously.

As the size of the lines gets smaller in memory device, the damage caused by etching may bring about a more significant impact. For example, the effectiveness of a memory cell at storing data may be related to an amount of bulk that is undamaged. After the sidewall 250 of the chalcogenide material 230 is exposed, subsequent steps (such as etching the bottom electrode material 225, cleaning phases, or deposition phases) may damage the chalcogenide material and/or cause unwanted chemical constituent mixing in one or more layers, thereby reducing the volume of bulk of the chalcogenide material 230 that is useful for storing information. As the size of the material gets smaller, the percentage of the bulk of the chalcogenide material damaged by a given process may increase. To mitigate damage to a material after etching, a material (e.g., a sealant material) may be deposited during the etching phase to form a protective liner along the exposed sidewall of the material being protected.

A sealant material 255 may be deposited into the trench 245 of memory array 200-*b*. The sealant material 255 may be formed as a protective layer over the one or more portions of the exposed sidewalls. The sealant material 255 may be formed to a predetermined thickness. Additionally or alternatively, the sealant material 255 may include silicon.

The sealant material 255 may contact a first sidewall, a second sidewall, and/or a bottom wall of each trench 245. After deposition, the sealant material 255 may contact the sidewall 250 of the chalcogenide material 230. Forming the liner 270 (shown in FIG. 2C) on the sidewall 250 of the chalcogenide material 230 may protect the chalcogenide material 230 from different subsequent etching, cleaning, or deposition processes (e.g., continuous plasma polymerization, plasma deposition, etc.) that can degrade the chalcogenide material 230 by damaging the surface and/or causing unwanted chemical constituent mixing in one or more layers. The liner 270 may enable an edge composition on chalcogenide material 230 through a targeted bonding process, thereby reducing damage that can occur during subsequent processes (e.g., a dry etch process, a plasma etch process, a wet etch process, etc.) through the use of an ion/radical cycle. For example, an energetic reaction species, such as radicals and/or ions can be created during an etch process. In some cases, radical and/or ion transfer can occur (e.g., one or more ions and/or radicals may be deposited on one or more edges of the chalcogenide material). Additionally or alternatively, the one or more ions and/or radicals may be positioned in the bulk of the chalcogenide material.

Figure 2C:
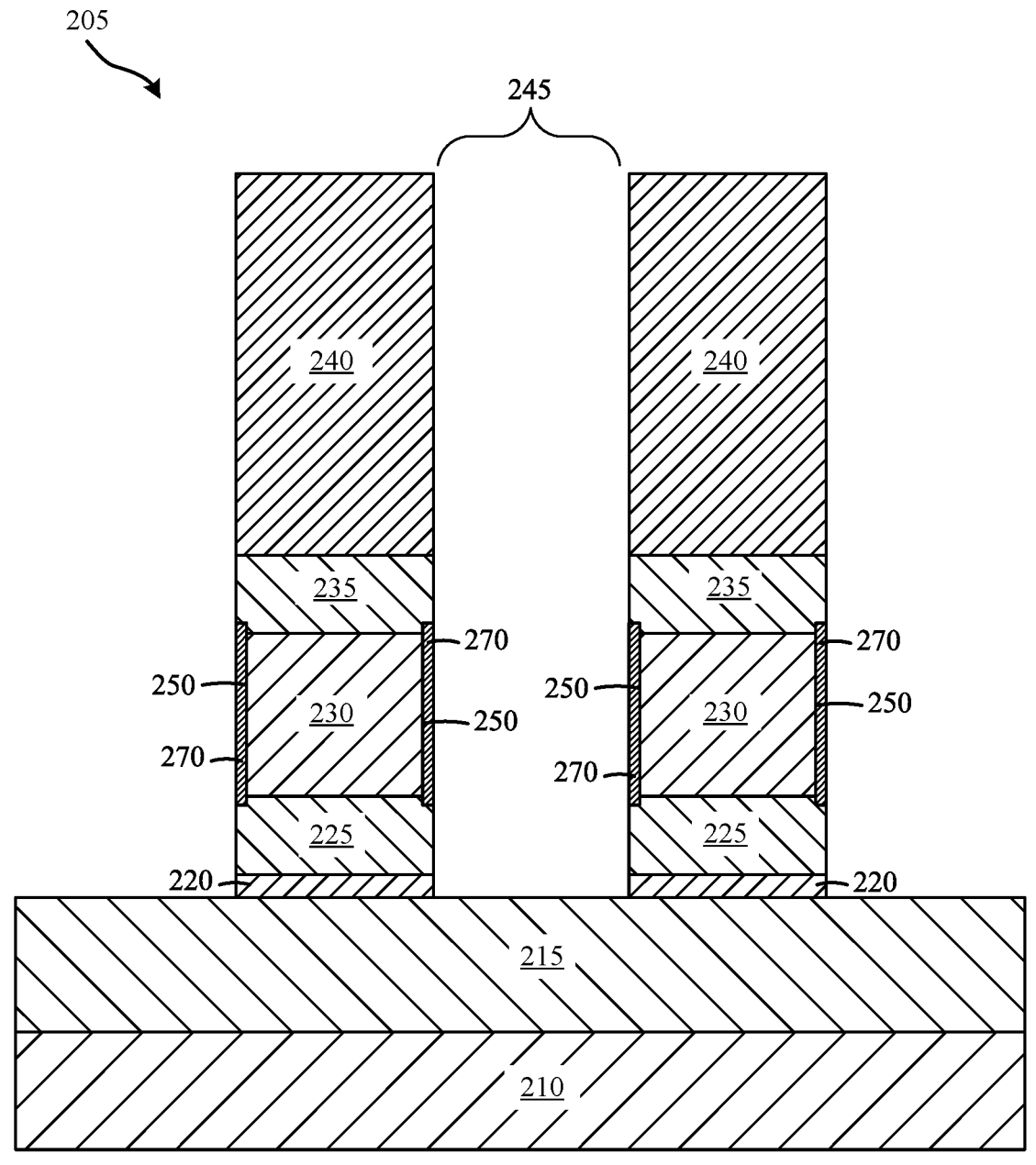

As shown in FIG. 2B, ions 260 and/or radicals 265 may be formed on the sidewall 250 of the chalcogenide material 230 by a radical-substitution process or reaction to create a reactive intermediate handle. The ions 260 and/or radicals 265 may be deposited to form the liner 270, as shown by FIG. 2C. The liner 270 may be formed on chalcogenide material 230 to mitigate contamination and/or elemental loss associated with subsequent phases or operations of the manufacturing process.

The liner 270 may be formed using a strong bonding scheme as described with reference to FIG. 3. Alternatively, the liner 270 may be formed using a weak bonding scheme as described with reference to FIG. 4. When using the weak bonding scheme, a composition of one or more portions of the liner 270 may be altered by subsequent operations in the manufacturing scheme. In such examples, the sealant material deposited to form the liner 270 may be configured to be altered by the chemistries of the subsequent operations. In some examples of the weak bonding case, sidewall 250 of the chalcogenide material 230 may be oxidized. Later, reduction may occur in a deposition process (e.g., an ALD or CVD deposition process).

The sealant material may be deposited concurrently with performing the etch of the chalcogenide material 230. In some examples, the sealant material may be deposited after etching the chalcogenide material 230, but before etching the bottom electrode material 225. When etching the bottom electrode material 225, the liner 270 formed by the sealant material may protect the chalcogenide material 230 from damaging the chalcogenide material 230 and/or causing unwanted chemical constituent mixing with the chalcogenide material 230. Etching the bottom electrode material 225 may occur after the sealant material is deposited. Etching the bottom electrode material 225 may still damage the liner 270 or cause chemical constituent mixing with the liner 270. In some cases, the liner 270 may be repaired during or after etching the bottom electrode material 225 by depositing sealant material (e.g., a third sealant material) to replenish, repair, or add to the liner 270. The liner 270 may be repaired by depositing more sealant material after or during any operation or phase of the manufacturing process.

FIG. 2C illustrates an example of a cross-sectional view of the memory array 200-c that supports a protective sealant for chalcogenide material and methods for forming the same in accordance with examples as disclosed herein. The memory array 200-c may be an example of the memory array 200-b described with reference to FIG. 2B, after an etch and/or wet clean process has been performed on portions of the stack 205 of material. One or more liners 270 are formed on sidewalls 250 of the chalcogenide material 230 as part of the etching phase. The liner 270 (e.g., an engineered sidewall of the chalcogenide material 230) may be an example of a self-assembled monolayer (SAM), or covalently bonded atom or compound, further described with reference to FIGS. 3 and 4. Additionally or alternatively, the liner 270 may be a film comprised of one or more SAMs. The liner 270 may extend between the top electrode material 235 (e.g., a first conductive material) and the bottom electrode material 225 (e.g., a second conductive material). For example, the liners 270 may be formed on the one or more edges of the chalcogenide material 230.

The memory array 200-c with the liner 270 may occur after etching phase in the strong bonding case described with reference to FIG. 3. Alternatively, the memory array 200-c with the liner 270 may occur after a cleaning phase of the manufacturing process in the weak bonding case described with reference to FIG. 4.

A cleaning phase of a manufacturing process may include a wet clean process to remove one or more materials from the stack 205 of materials. During etching processes and other processes, various materials or contaminants may be left on the stack 205 of material. To clean those materials or contaminants from the stack 205, the stack 205 may be washed with or immersed in various chemicals.

As part of the weak bonding case, the chemistries of the wet clean process may be operable to alter the composition of the liner 270. In some examples, the wet clean process may replace one or more weakly etched terminated bonds through oxidation. In such examples, the cleaning phase may cause at least portions of the liner to oxidize. In some examples, the liner 270 is configured to protect the chalcogenide material 230 from reactions during the cleaning phase and the deposition phase that occur after the etching phase.

Figure 2D:
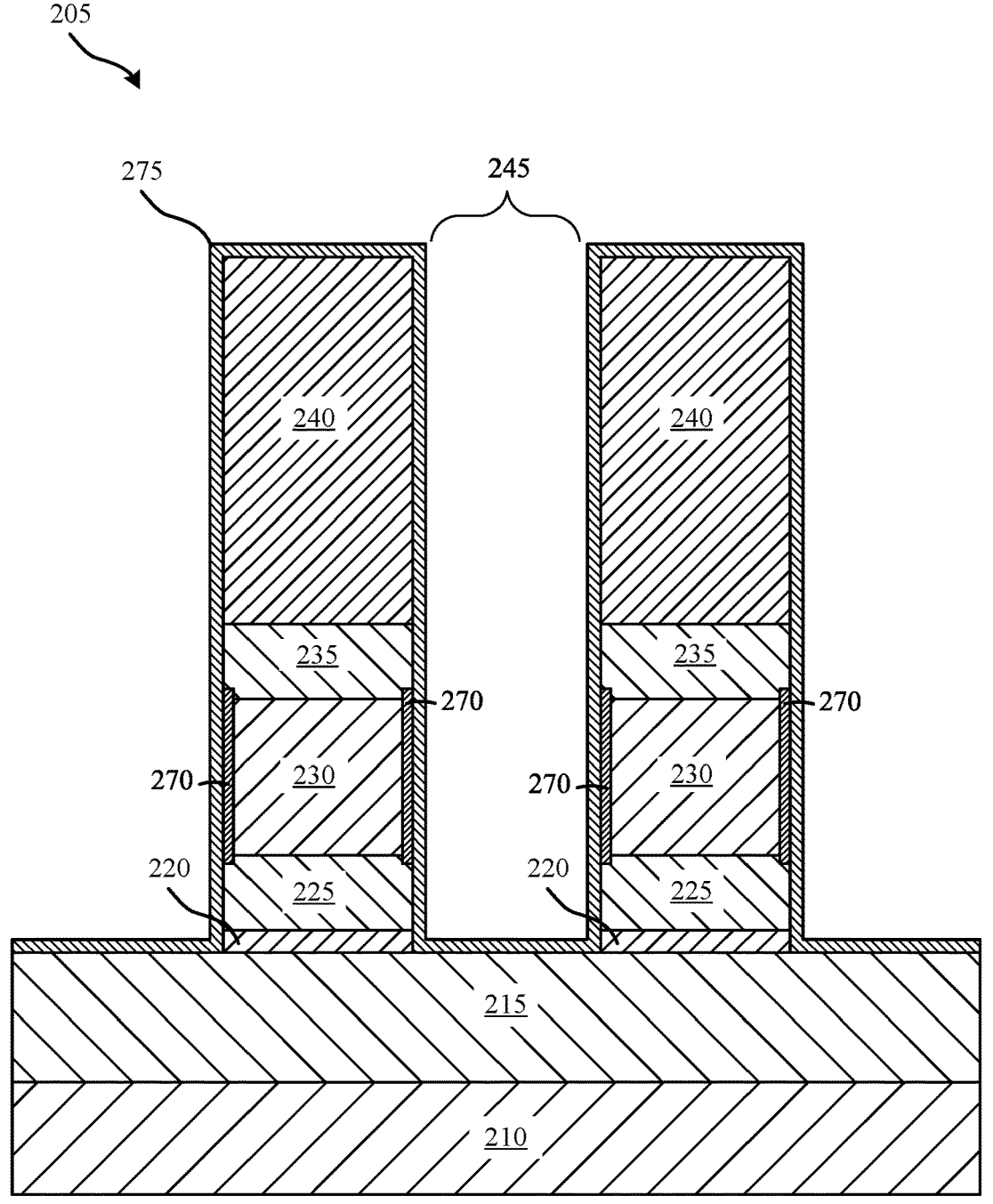

FIG. 2D illustrates an example of a cross-sectional view of the memory array 200-d that supports a protective sealant for chalcogenide material and methods for forming the same in accordance with examples as disclosed herein. The memory array 200-d may be an example of the memory array 200-c described with reference to FIG. 2C after a liner 275 is deposited. In some cases, the liner 275 may be an example of a sacrificial liner.

The liner 275 (e.g., a second liner) may be coupled with the liner 270, the top electrode material 235, the bottom electrode material 225, the hard mask material 240, the conductive material 215, the lamina material 220, or a combination thereof. The liner 275 may be a different material than the liner 270. In some cases, a second liner may be an example of the liner 275. The liner 275 may be configured to protect portions of stack 205 from subsequent operations or phases of the manufacturing process. For example, the liner 275 may protect the stack 205 from portions of a subsequent etching phase, a subsequent cleaning phase, or a subsequent sealing phase, or a combination thereof. In some cases, the liner 275 may be removed before the manufacturing process is complete. In some cases, the liner 275 may not be removed before the manufacturing process is complete.

FIG. 2E illustrates an example of a cross-sectional view of the memory array 200-e that supports a protective sealant for chalcogenide material and methods for forming the same in accordance with examples as disclosed herein. The memory array 200-e may be an example of the memory array 200-d described with reference to FIG. 2D after a sealant material is deposited to form a second liner 280. The memory array 200-e illustrates an example of a tapered pillar-like structure. In some cases, the memory array 200-e may be formed to be a vertical pillar-like structure. For example, forming the second liner on the memory array 200-d may generate a vertical pillar-like structure. In other examples, such as the example shown by the memory array 200-e, the pillar-like structure may be tapered in some cases (e.g., due to some degree of isotropy of the etch).

The second liner 280 may be formed over the liner 270 or the liner 275, the top electrode material 235, the bottom electrode material 225, the hard mask material 240, the conductive material 215, the lamina material 220, the oxide material 210, or a combination thereof. The second liner 280 may be a different material than the liner 270. In some examples, second liner 280 may be an example of a silicon nitride liner.

To form the memory array 200-e, the memory array 200-d may go through a variety of operations or phases. For example, an etching operation (e.g., part of an etching phase) may be applied to the memory array 200-d to remove some of the conductive material 215 to form conductive lines (e.g., such as word lines). Such an etching process may expose one or more sidewalls of the conductive material 215 or one or more walls of the oxide material 210 or a combination thereof. During the etching step, portions of the hard mask material 240 or the liner 275 or a combination thereof may be removed. A cleaning operation (e.g., part of a cleaning phase) may be applied to the memory array to remove contaminants after the etching operation. A deposition operation (e.g., part of a deposition phase) may be applied to the memory array to form the second liner 280. The deposition operation may seal the resulting stack of materials.

To obtain the final pillar structure of the memory array 200, one or more additional operations may be performed. For example, a filling material may be deposited in trenches 245. In some examples, the hard mask material 240 may be removed to expose the top electrode material 235. In some examples, a conductive material (not shown) may be deposited to form a digit line. In some examples, a pillar may define the pillars in a second direction perpendicular to the first direction by removing portion of the conductive material that forms the digit line, the top electrode material 235, the chalcogenide material 230, the bottom electrode material 225, or a combination thereof. During the etch in the second direction, a sidewall of the chalcogenide material may be protected with a liner material, in a similar fashion as described with reference to FIGS. 2A-2E and an additional liner may be used.

FIGS. 2A-2E illustrate a process flow for forming a memory array that includes an etching phase to open the chalcogenide material 230, followed by a cleaning phase, followed by a deposition phase to deposit the liner 275, followed by an etching phase, a cleaning phase, and a deposition phase to seal the stack (e.g., deposit the second liner 280). Other process flows that utilize the same features of the liner 270 are also possible.

In some examples of a process flow for forming a memory array, the process flow may not include a deposition of a liner 275. In such examples, the etching phase, cleaning phase, and deposition phase may be completed in one sequence.

In some examples of a process flow for forming a memory array, the process flow may include an etching phase where the in-situ etch chemistry techniques can protect one or more features of the memory array throughout the process flow. In such examples, the liner 270 may be repaired after operations or phases are complete or may be repaired concurrently with the etching phase and/or other phases.

In some examples of a process flow for forming a memory array, the process flow may include an etch back process occurs in which the liner 270 is removed completely after the etching phase. In such examples, during a cleaning phase and/or during a deposition phase, a repair to the liner 270 may occur. In such cases, a manufacturing system may be configured to perform, after the etching phase, an etch back process that removes at least a portion of the first liner, and deposit the first sealant material after performing the etch back process to repair the first liner.

Figure 3:
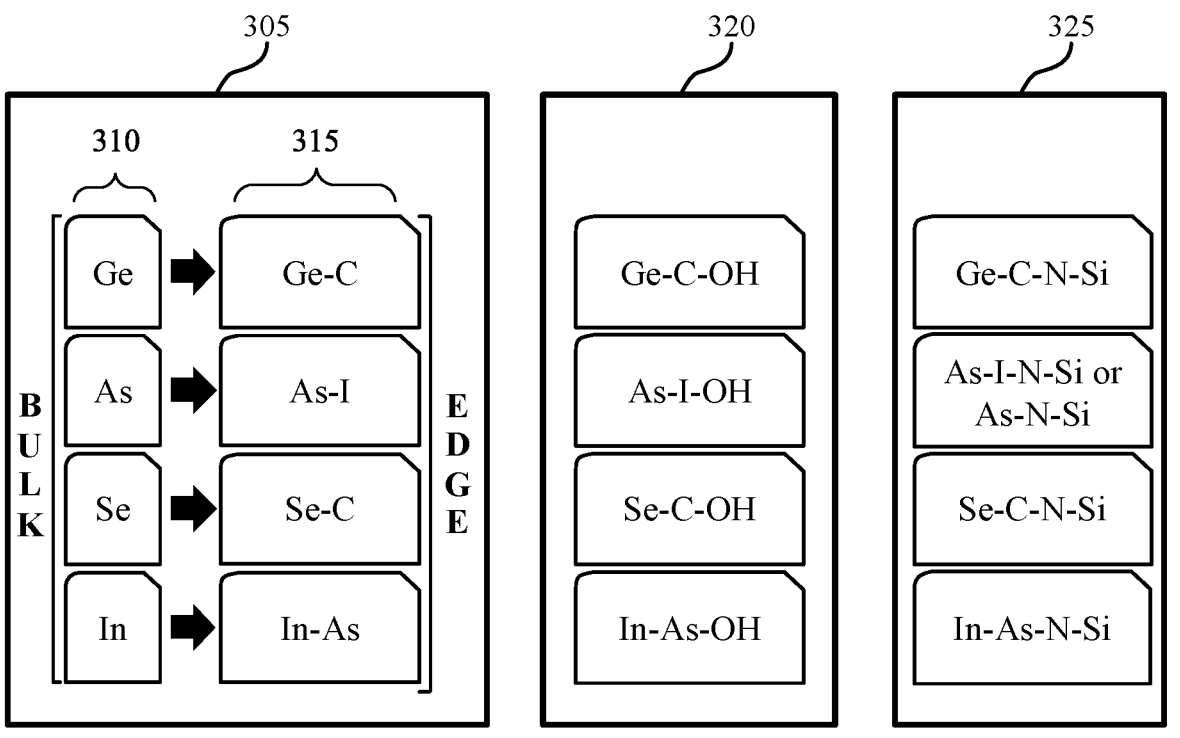
FIG. 3 illustrates an example of a strong bonding case that supports protective sealant for chalcogenide material and methods for forming the same in accordance with examples as disclosed herein.

FIG. 3 illustrates an example of a strong bonding case 300 that supports a protective sealant for chalcogenide material and methods for forming the same in accordance with examples as disclosed herein. The strong bonding case 300 for the liner 270 includes forming strong bonds with the chalcogenide material 230.

Box 305 includes a first representation 310 of a plurality of possible chemical compositions of the chalcogenide material 230 before depositing a sealant material to form the liner 270 and a second representation 315 of a plurality of possible chemical compositions of the sidewall 250 of the chalcogenide material 230 after the sealant material is deposited.

As described with reference to FIG. 2B, the bulk may be associated with chalcogenide material 230 and in this example can comprise one or more chalcogenide elements or compounds, such as one or more Ge, As, Se, and/or In, among other elements. The chemical pathways introduced in the strong bonding case may occur during the etching phase. In this example, a deposition process may introduce chemically-active ions, radicals, and/or chemical compounds to the exposed bulk material. A feed gas (e.g., $C_2H_2$, $CH_4$, $CF_3I$, or $AsH_3$, among others) may be introduced during the deposition process to form a strongly bonded and reactive edge composition, such as a SAM, along one or more surfaces of the bulk material. During this process, preferred elements may be deposited on the one or more surfaces of the bulk material. For example, if the bulk material comprises T or Q, an organo-T compound (TC) or organo-Q compound (QC) compound may form, respectively. In another example, if the bulk material comprises X or Y, an X-I or an X-Y bond may form at the edge, respectively. For example, if the bulk material comprises Ge or Se, an organogermanium (GeC) or organoselenium (SeC) compound may form, respectively. In another example, if the bulk material comprises As or In, an AsI or an InAs bond may form at the edge, respectively. The bulk may be comprised of one or more Group 13, Group 14, Group 15, Group 16, and/or Group 17 elements of the International Union of Applied and Pure Chemistry (IUPAC) Periodic Table, released Dec. 1, 2018.

In this example, the strong bonds formed during the dry etch step may have bond dissociation energies greater than 439 kJ/mol. The edge may be used as a reactive intermediate, for example, a subsequent wet clean process may introduce hydroxyl groups (OH), further changing the edge composition. Box 320 includes a representation of a plurality of possible chemical compositions of the chalcogenide material 230 and/or the liner 270 after the cleaning phase. For example, an intermediate edge composition such as T-COH, Q-IOH, T-COH, or Q-Y-OH may be formed. For example, an intermediate edge composition such as GeCOH, AsIOH, SeCOH, or InAsOH may be formed. The hydroxyl groups may further undergo a substitution reaction, where they are replaced by silicon nitride during a deposition operation (e.g., ALD or CVD). In some cases, the deposition operation may be configured to deposit the liner 275 described with reference to FIG. 2D. In some cases, the deposition operation may be configured to deposit sealant material to form the second liner 280 described with reference to FIG. 2E. In this way, the initial strong bond is maintained, forming an engineered side wall (as described with reference to FIGS. 2C-2E) with a composition of T-CNSi, X-INSi, Q-CNSi, and/or Y-X-NSi. In a more specific example, the initial strong bond may be maintained, forming an engineered side wall with a composition of GeCNSi, AsINSi, SeCNSi, and/or InAsNSi. Box 325 includes a representation of a plurality of possible chemical compositions of the chalcogenide material 230 and/or the liner 270 after the deposition or sealing phase.

Figure 4:
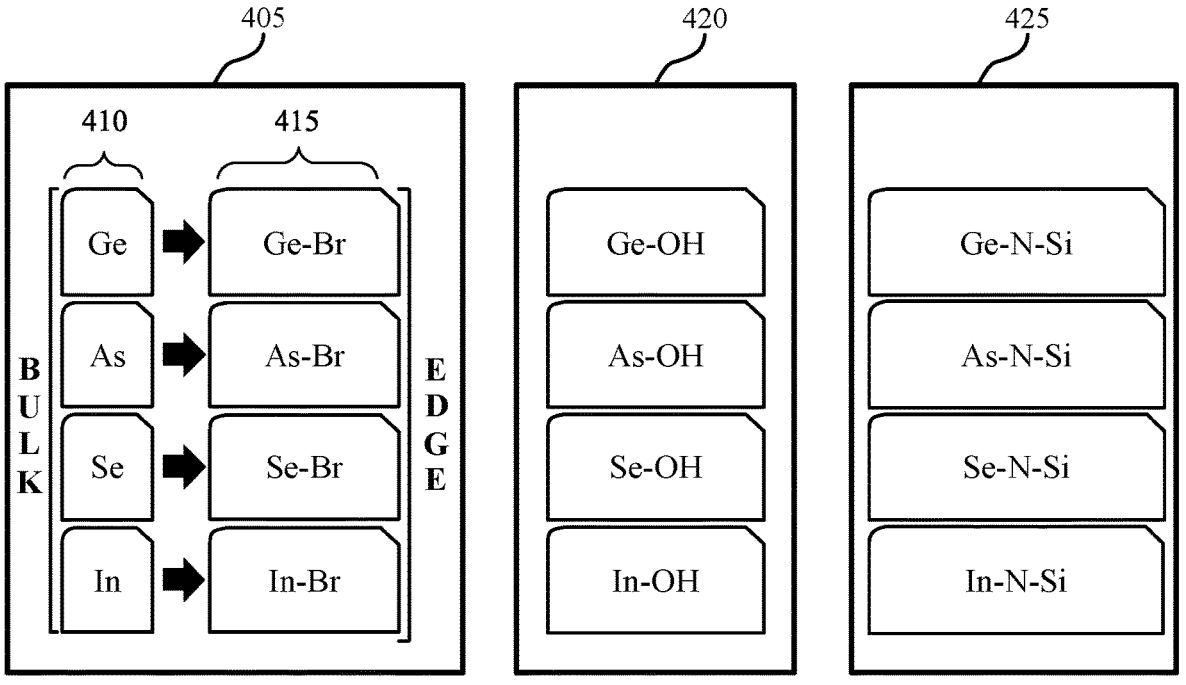
FIG. 4 illustrates an example of a weak bonding case that supports protective sealant for chalcogenide material and methods for forming the same in accordance with examples as disclosed herein.

FIG. 4 illustrates an example of a weak bonding case 400 that supports a protective sealant for chalcogenide material and methods for forming the same in accordance with examples as disclosed herein. The weak bonding case 400 for the liner 270 includes forming weak bonds with the chalcogenide material 230.

Box 405 includes a first representation 410 of a plurality of possible chemical compositions of the chalcogenide material 230 before depositing a sealant material to form the liner 270 and a second representation 415 of a plurality of possible chemical compositions of the sidewall 250 of the chalcogenide material 330 after the sealant material is deposited.

As described with reference to FIG. 2B, and FIG. 3, the bulk may be associated with chalcogenide material 230 and in this example can include T, X, Q, and/or Y (e.g., Ge, As, Se, and/or In). In this example, chemical bonds may be formed on the chalcogenide material 230 during the etching phase and during other phases. In this example, the bulk material may be exposed to one or more hydrogen halides (e.g., HBr) during an etching operation, thus creating a reactive handle prone to a controlled chemical substitution during a subsequent oxidation step. The reactive handle in this step may be considered a weakly bonded material to be exchanged during a cleaning phase and/or a deposition phase. In some examples, a weak bond may be understood to be a chemically bonded species associated with a bond dissociation energy less than 439 kJ/mol. As shown, the bulk may be comprised of one or more Group 13, Group 14, Group 15, Group 16, and/or Group 17 elements from the IUPAC Periodic Table, released Dec. 1, 2018.

For example, by exposing the bulk (e.g., chalcogenide material 230) surface to HBr, a Br terminated surface may result (e.g., TBr, XBr, QBr, YBr, GeBr, AsBr, SeBr, InBr, etc.). During a clean step (e.g., the oxidation step), the Br terminated surface (the edge) may be exposed to hydroxyl groups, thus replacing the Br atoms during a substitution reaction with the hydroxyl group (e.g., $TBr+H_2O \leftrightarrow TOH+HBr$ or $GeBr+H_2O \leftrightarrow GeOH+HBr$) Box 420 includes a representation of a plurality of possible chemical compositions of the chalcogenide material 230 and/or the liner 270 after the cleaning phase. After this step, the hydroxyl terminated surface of the bulk may undergo a reduction reaction during a deposition phase (e.g., an ALD or CVD) to replace the hydroxyl group forming an engineered sidewall (with reference to FIGS. 2C-2E). In some cases, the deposition operation may be configured to deposit the liner 275 described with reference to FIG. 2D. In some cases, the deposition operation may be configured to deposit sealant material to form the second liner 280 described with reference to FIG. 2E. The engineered sidewall may have a composition of TNSi, XNSi, QNSi, and/or YNSi or GeNSi, AsNSi, SeNSi, and/or InNSi, among other compositions. Box 425 includes a representation of a plurality of possible chemical compositions of the chalcogenide material 230 and/or the liner 270 after the deposition or sealing phase.

FIG. 5 shows a flowchart illustrating a method or methods 500 that supports a protective sealant for chalcogenide material and methods for forming the same in accordance with aspects of the present disclosure. The operations of method 500 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At 505, the method 500 may include forming a stack of materials that includes a chalcogenide material for storing information and/or a switching device and a conductive material. The operations of 505 may be performed according to the methods described herein.

At 510, the method 500 may include etching the stack of materials to form a pillar as part of an etching phase of a manufacturing process. The operations of 510 may be performed according to the methods described herein.

At 515, the method 500 may include etching, as part of the etching phase, the chalcogenide material to expose a sidewall of the chalcogenide material using a first set of etching parameters. The operations of 515 may be performed according to the methods described herein.

At 520, the method 500 may include depositing, as part of the etching phase, a first sealant material on the sidewall of the chalcogenide material to form a first liner after or during at least a portion of etching the chalcogenide material. The operations of 520 may be performed according to the methods described herein.

At 525, the method 500 may include etching, as part of the etching phase, the conductive material using a second set of etching parameters after depositing the first sealant material. The operations of 525 may be performed according to the methods described herein.

At 530, the method 500 may include depositing a second sealant material over the pillar to form a second liner as part of a deposition phase that occurs after the etching phase. The operations of 530 may be performed according to the methods described herein.

In some examples, an apparatus as described herein may perform a method or methods, such as the method 500. The apparatus may include features, means, or instructions (e.g., a non-transitory computer-readable medium storing instructions executable by a processor) for forming a stack of materials that includes a chalcogenide material for storing information and a conductive material, etching the stack of materials to form a pillar as part of an etching phase of a manufacturing process. The etching phase may include: depositing a first sealant material on the sidewall of the chalcogenide material to form a first liner after or during at least a portion of etching the chalcogenide material, etching the conductive material using a second set of etching parameters after depositing the first sealant material. The apparatus may also include features, means, or instructions (e.g., a non-transitory computer-readable medium storing instructions executable by a processor) for depositing a second sealant material over the pillar to form a second liner as part of a deposition phase that occurs after the etching phase.

Some examples of the method 500 and the apparatus described herein may further include operations, features, means, or instructions for depositing a third sealant material after etching the conductive material to repair the first liner coupled with the sidewall of the chalcogenide material, where depositing the second sealant material may be based on depositing the third sealant material after etching the conductive material.

In some examples of the method 500 and the apparatus described herein, depositing the first sealant material further may include operations, features, means, or instructions for depositing one or more elements configured to bond with the chalcogenide material to form the first liner. In some examples of the method 500 and the apparatus described herein, the one or more elements includes a radical form or ion or reactive compound. In some examples of the method 500 and the apparatus described herein, the one or more elements include one or more halogen elements.

Some examples of the method 500 and the apparatus described herein may further include operations, features, means, or instructions for cleaning the pillar using a wet clean process as part of a cleaning phase that occurs after the etching phase, where depositing the second sealant material occurs after the cleaning phase.

In some examples of the method 500 and the apparatus described herein, the first liner may be configured to protect the chalcogenide material from reactions during the cleaning phase and the deposition phase that occur after the etching phase. In some examples of the method 500 and the apparatus described herein, the first liner may be configured to protect the chalcogenide material from one or more processes used to etch subsequent materials as part of the etching phase. In some examples of the method 500 and the apparatus described herein, the etching phase includes a dry etch process. In some examples of the method 500 and the apparatus described herein, the second liner includes silicon nitride.

FIG. 6 shows a flowchart illustrating a method or methods 600 that supports a protective sealant for chalcogenide material and methods for forming the same in accordance with aspects of the present disclosure. The operations of method 600 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At 605, the method 600 may include forming a stack of materials that includes a chalcogenide material for storing information and/or a switching material and a conductive material. The operations of 605 may be performed according to the methods described herein.

At 610, the method 600 may include etching the stack of materials to form a pillar as part of an etching phase of a manufacturing process. The operations of 610 may be performed according to the methods described herein.

At 615, the method 600 may include etching, as part of the etching phase, the chalcogenide material to expose a sidewall of the chalcogenide material using a first set of etching parameters. The operations of 615 may be performed according to the methods described herein.

At 620, the method 600 may include depositing, as part of the etching phase, a first sealant material on the sidewall of the chalcogenide material to form a first liner after etching the chalcogenide material. The operations of 620 may be performed according to the methods described herein.

At 625, the method 600 may include altering, as part of the etching phase, a composition of the first liner using a substitution-based reaction as part of a phase that occurs after the etching phase. The operations of 625 may be performed according to the methods described herein.

In some examples, an apparatus as described herein may perform a method or methods, such as the method 600. The apparatus may include features, means, or instructions (e.g., a non-transitory computer-readable medium storing instructions executable by a processor) for forming a stack of materials that includes a chalcogenide material for storing information and a conductive material and etching the stack of materials to form a pillar as part of an etching phase of a manufacturing process. The etching phase may include: etching the chalcogenide material to expose a sidewall of the chalcogenide material using a first set of etching parameters, depositing a first sealant material on the sidewall of the chalcogenide material to form a first liner after etching the chalcogenide material, and altering, as part of the etching phase, a composition of the first liner using a substitution-based reaction as part of a phase that occurs after the etching phase.

Some examples of the method 600 and the apparatus described herein may further include operations, features, means, or instructions for depositing a second sealant material over the pillar to form a second liner as part of a deposition phase that occurs after the etching phase, where altering the composition of the first liner occurs during the deposition phase and the phase includes the deposition phase. Some examples of the method 600 and the apparatus described herein may further include operations, features, means, or instructions for cleaning the pillar using a wet clean process as part of a cleaning phase that occurs after the etching phase, where altering the composition of the first liner occurs during the cleaning phase and the phase includes the cleaning phase.

In some examples of the method 600 and the apparatus described herein, depositing the first sealant material further may include operations, features, means, or instructions for oxidizing a surface of the sidewall of the chalcogenide material. In some examples of the method 600 and the apparatus described herein, the etching phase further may include operations, features, means, or instructions for etching the conductive material using a second set of etching parameters as part of the etching phase and after depositing the first sealant material, where altering the composition of the first liner may be based on etching the conductive material.

In some examples of the method 600 and the apparatus described herein, depositing the first sealant material further may include operations, features, means, or instructions for depositing one or more elements configured to bond with the chalcogenide material to form the first liner. In some examples of the method 600 and the apparatus described herein, the one or more elements include one or more ions.

FIG. 7 shows a flowchart illustrating a method or methods 700 that supports a protective sealant for chalcogenide material and methods for forming the same in accordance with aspects of the present disclosure. The operations of method 700 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At 705, the method 700 may include forming a stack of materials that includes a chalcogenide material for storing information and a conductive material. The operations of 705 may be performed according to the methods described herein.

At 710, the method 700 may include etching the stack of materials to form a pillar as part of an etching phase of a manufacturing process. The operations of 710 may be performed according to the methods described herein.

At 715, the method 700 may include etching, as part of the etching phase, the chalcogenide material to expose a sidewall of the chalcogenide material using a first set of etching parameters. The operations of 715 may be performed according to the methods described herein.

At 720, the method 700 may etching, as part of the etching phase, the conductive material using a second set of etching parameters after depositing the first sealant material. The operations of 720 may be performed according to the methods described herein.

At 725, the method 700 may depositing, as part of the etching phase, a first sealant material on the sidewall of the chalcogenide material to form a first liner after etching the chalcogenide material. The operations of 725 may be performed according to the methods described herein.

In some examples, an apparatus as described herein may perform a method or methods, such as the method 700. The apparatus may include features, means, or instructions (e.g., a non-transitory computer-readable medium storing instructions executable by a processor) for forming a stack of materials that includes a chalcogenide material for storing information and a conductive material and etching the stack of materials to form a pillar as part of an etching phase of a manufacturing process. The etching phase may include: etching the chalcogenide material to expose a sidewall of the chalcogenide material using a first set of etching parameters, depositing a first sealant material on the sidewall of the chalcogenide material to form a first liner after etching the chalcogenide material, and etching the conductive material using a second set of etching parameters after depositing the first sealant material.

Some examples of the method 700 and the apparatus described herein may further include operations, features, means, or instructions for cleaning the pillar using a wet clean process as part of a cleaning phase that occurs after the etching phase. In some examples of the method 700 and the apparatus described herein, the first liner may be configured to protect the chalcogenide material from reactions during the cleaning phase and other phases that occur after the etching phase.

In some examples of the method 700 and the apparatus described herein, depositing the first sealant material further may include operations, features, means, or instructions for depositing one or more elements configured to bond with the chalcogenide material to form the first liner. In some examples of the method 700 and the apparatus described herein, the one or more elements includes a radical form or ion or reactive compound. In some examples of the method 700 and the apparatus described herein, the one or more elements include one or more halogen elements.

Figure 8:
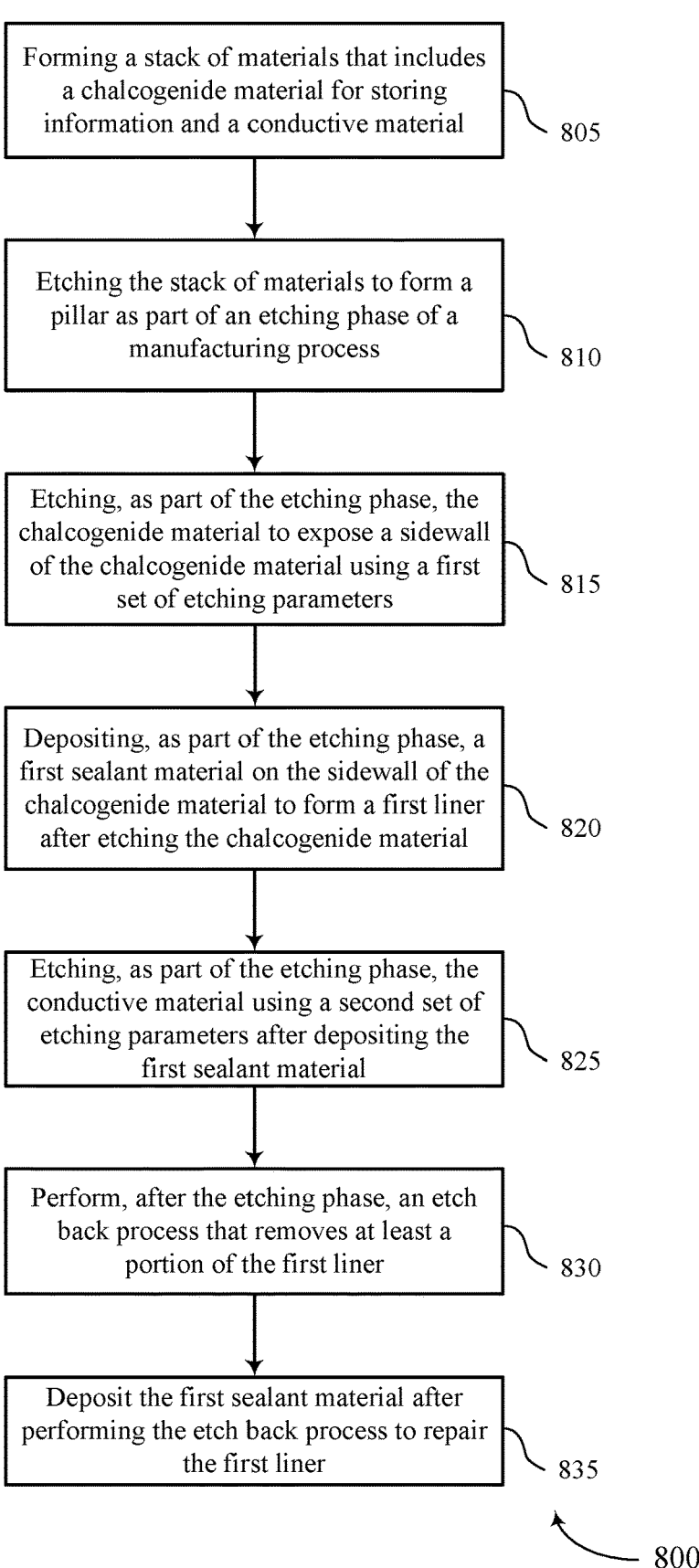

FIG. 8 shows a flowchart illustrating a method or methods 800 that supports a protective sealant for chalcogenide material and methods for forming the same in accordance with aspects of the present disclosure. The operations of method 800 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At 805, the method 800 may include forming a stack of materials that includes a chalcogenide material for storing information and a conductive material. The operations of 805 may be performed according to the methods described herein.

At 810, the method 800 may include etching the stack of materials to form a pillar as part of an etching phase of a manufacturing process. The operations of 810 may be performed according to the methods described herein.

At 815, the method 800 may include etching, as part of the etching phase, the chalcogenide material to expose a sidewall of the chalcogenide material using a first set of etching parameters. The operations of 815 may be performed according to the methods described herein.

At 820, the method 800 may include depositing, as part of the etching phase a first sealant material on the sidewall of the chalcogenide material to form a first liner after etching the chalcogenide material. The operations of 820 may be performed according to the methods described herein.

At 825, the method 800 may include etching, as part of the etching phase, the conductive material using a second set of etching parameters after depositing the first sealant material. The operations of 825 may be performed according to the methods described herein.

At 830, the method 800 may include performing, after the etching phase, an etch back process that removes at least a portion of the first liner. The operations of 830 may be performed according to the methods described herein.

At 835, the method 800 may include depositing the first sealant material after performing the etch back process to repair the first liner. The operations of 835 may be performed according to the methods described herein.

In some examples, an apparatus as described herein may perform a method or methods, such as the method 800. The apparatus may include features, means, or instructions (e.g., a non-transitory computer-readable medium storing instructions executable by a processor) for forming a stack of materials that includes a chalcogenide material for storing information and a conductive material, etching the stack of materials to form a pillar as part of an etching phase of a manufacturing process. The etching phase may include: etching the chalcogenide material to expose a sidewall of the chalcogenide material using a first set of etching parameters depositing a first sealant material on the sidewall of the chalcogenide material to form a first liner after etching the chalcogenide material, and etching the conductive material using a second set of etching parameters after depositing the first sealant material. The apparatus may also include features, means, or instructions (e.g., a non-transitory computer-readable medium storing instructions executable by a processor) for performing, after the etching phase, an etch back process that removes at least a portion of the first liner, and depositing the first sealant material after performing the etch back process to repair the first liner.

Some examples of the method 800 and the apparatus described herein may further include operations, features, means, or instructions for cleaning the pillar using a wet clean process as part of a cleaning phase that occurs after the etching phase, where performing the etch back process occurs after cleaning the pillar using the wet clean process. Some examples of the method 800 and the apparatus described herein may further include operations, features, means, or instructions for depositing a second sealant material over the pillar to form a second liner as part of a deposition phase that occurs after depositing the first sealant material to repair the first liner.

In some examples of the method 800 and the apparatus described herein, depositing the first sealant material further may include operations, features, means, or instructions for depositing one or more elements configured to bond with the chalcogenide material to form the first liner. In some examples of the method 800 and the apparatus described herein, the first liner may be configured to protect the chalcogenide material from one or more processes used to etch subsequent materials as part of the etching phase. In some examples of the method 800 and the apparatus described herein, the etching phase includes a dry etch process.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include a pillar including a first electrode, a chalcogenide material for storing information coupled with the first electrode, and a second electrode coupled with the chalcogenide material, a first liner coupled with a sidewall of the chalcogenide material and extending between the first electrode and the second electrode, and a second liner coupled with the first liner, the first electrode, and the second electrode of the pillar, the second liner being a different material than the first liner. Some examples of the apparatus may include a conductive line coupled with the first electrode of the pillar. Some examples of the apparatus may include a lamina positioned between the conductive line and the first electrode of the pillar.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of the memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an application-specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
a first pillar comprising a first electrode, a chalcogenide material for storing information coupled with the first electrode, and a second electrode coupled with the chalcogenide material;
a first liner in physical contact with a sidewall of the chalcogenide material and extending between the first electrode and the second electrode; and
a second liner in physical contact with the first liner, the first electrode, and the second electrode of the first pillar, the second liner being a different material than the first liner.

2. The apparatus of claim 1, further comprising:
a first conductive line coupled with the first electrode of the first pillar.

3. The apparatus of claim 2, further comprising:
an oxide material coupled with the first conductive line.

4. The apparatus of claim 2, further comprising:
a lamina positioned between the first conductive line and the first electrode of the first pillar.

5. The apparatus of claim 2, further comprising:
a second pillar comprising a third electrode, a second chalcogenide material for storing information coupled with the third electrode, and a fourth electrode coupled with the chalcogenide material;
a third liner coupled with a sidewall of the second chalcogenide material and extending between the third electrode and the fourth electrode, the third liner comprising a same material as the first liner, wherein the second liner is coupled with the third liner, the third electrode, and the fourth electrode of the second pillar; and
a second conductive line coupled with the third electrode of the second pillar.

6. The apparatus of claim 5, further comprising:
an oxide material coupled with the first conductive line and the second conductive line.

7. The apparatus of claim 5, further comprising:
a first lamina positioned between the first conductive line and the first electrode of the first pillar; and a second lamina positioned between the second conductive line and the third electrode of the second pillar.

8. The apparatus of claim 5, further comprising:

a trench separating the first pillar and the second pillar.

9. The apparatus of claim 8, further comprising:

a filling material positioned within the trench separating the first pillar and the second pillar.

10. The apparatus of claim 1, wherein the first liner comprises a first portion in physical contact with a first sidewall of the chalcogenide material and a second portion in physical contact with a second sidewall of the chalcogenide material.

11. The apparatus of claim 1, wherein the first liner comprises one or more self-assembled monolayers.

12. The apparatus of claim 1, wherein the first liner is in physical contact with the chalcogenide material via forming weak chemical bonds or strong chemical bonds with the chalcogenide material.

13. The apparatus of claim 1, wherein the chalcogenide material comprises at least one of a germanium compound, an arsenic compound, a selenium compound, and an indium compound.

14. The apparatus of claim 13, wherein the sidewall of the chalcogenide material comprises a silicon compound.

\* \* \* \* \*